US010263164B2

United States Patent
Keith et al.

(10) Patent No.: US 10,263,164 B2
(45) Date of Patent: Apr. 16, 2019

(54) ELECTRONIC COMPONENT INCLUDING A MATERIAL COMPRISING EPDXYSILANE-MODIFIED POLYORGANOSILOXANE

(71) Applicant: OSRAM Opto Semiconductors GmbH, Regensburg (DE)

(72) Inventors: Christina Keith, Neutraubling (DE); Kathy Schmidtke, Mainburg (DE); Klaus Hoehn, Forchheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/549,136

(22) PCT Filed: Feb. 4, 2016

(86) PCT No.: PCT/EP2016/052398
§ 371 (c)(1),
(2) Date: Aug. 4, 2017

(87) PCT Pub. No.: WO2016/124696
PCT Pub. Date: Aug. 11, 2016

(65) Prior Publication Data
US 2018/0033927 A1 Feb. 1, 2018

(30) Foreign Application Priority Data
Feb. 6, 2015 (DE) .......... 10 2015 101 748

(51) Int. Cl.
*C08L 83/00* (2006.01)
*C08G 77/12* (2006.01)
(Continued)

(52) U.S. Cl.
CPC ............. *H01L 33/56* (2013.01); *C08G 77/12* (2013.01); *C08G 77/20* (2013.01); *C08K 5/5435* (2013.01);
(Continued)

(58) Field of Classification Search
CPC ........ H01L 33/56; H01L 33/486; C08L 83/04; C08G 77/20; C08G 77/12
See application file for complete search history.

(56) References Cited

U.S. PATENT DOCUMENTS 4,754,013 A * 6/1988 Antonen .................. C08K 5/54
528/15
6,281,284 B1 * 8/2001 Sakamoto ................ C08K 3/22
524/785

(Continued)

FOREIGN PATENT DOCUMENTS

DE        69824363 T2    6/2005
DE    602004007016 T2    2/2008
(Continued)

*Primary Examiner* — Galina G Yushina
(74) *Attorney, Agent, or Firm* — McDermott Will & Emery LLP

(57) ABSTRACT

The present invention relates to an optoelectronic component comprising a semiconductor (1) and a polyorganosiloxane. The polyorganosiloxane is obtainable by crosslinking a composition comprising a first organosiloxane having at least one terminal vinyl group, a second organosiloxane having at least one silicon-hydrogen bond and an alkoxysilane having at least one epoxy group. Additionally specified is a method of producing an optoelectronic component.

18 Claims, 4 Drawing Sheets

(51) Int. Cl.
  *H01L 33/56* (2010.01)
  *C08G 77/20* (2006.01)
  *C08L 83/04* (2006.01)
  *C08K 5/5435* (2006.01)
  *H01L 33/48* (2010.01)

(52) U.S. Cl.
  CPC ............... *C08L 83/00* (2013.01); *C08L 83/04* (2013.01); *H01L 33/486* (2013.01); *H01L 2224/32225* (2013.01)

(56) References Cited

U.S. PATENT DOCUMENTS

| | | | |
|---|---|---|---|
| 7,732,553 B2 | 6/2010 | Hawker et al. | |
| 7,943,719 B2 | 5/2011 | Hawker et al. | |
| 2010/0276721 A1* | 11/2010 | Yoshitake | C08L 83/00 257/99 |
| 2012/0168815 A1 | 7/2012 | Koh et al. | |
| 2013/0221400 A1 | 8/2013 | Tanikawa et al. | |
| 2015/0001569 A1 | 1/2015 | Yoshitake et al. | |

FOREIGN PATENT DOCUMENTS

| | | |
|---|---|---|
| DE | 60223832 T2 | 10/2008 |
| DE | 112009002625 T5 | 1/2012 |
| EP | 2105466 B1 | 9/2009 |

* cited by examiner

ELECTRONIC COMPONENT INCLUDING A MATERIAL COMPRISING EPDXYSILANE-MODIFIED POLYORGANOSILOXANE

The present invention relates to an optoelectronic component and a method for the production thereof.

It is an object of the invention to provide an optoelectronic component having improved composite stability and weathering resistance.

This object is achieved by an optoelectronic component and a method of producing an optoelectronic component according to the independent claims. Further embodiments of the component and of the method are provided by dependent claims.

An optoelectronic component comprising a semiconductor and a polyorganosiloxane are provided. The polyorganosiloxane is obtainable by crosslinking a composition comprising:
- a first organosiloxane having at least one terminal vinyl group,
- a second organosiloxane having at least one silicon-hydrogen bond and
- an alkoxysilane having at least one epoxy group.

In the industrial production of optoelectronic components, such as e.g. light-emitting diodes (LEDs) and solar cells, silicones are used e.g. as an assembly material or adhesion promoter, an encapsulation or a matrix material for optical elements, such as e.g. lenses, light conversion elements or reflectors. However, the inventors of the present invention have found that the use of conventional, two-component, addition-crosslinking silicones often leads to problems with the reliability of these optoelectronic components. The cause was found to be that moisture and thermal loads in particular lead to delaminations in the interfacial region between silicone and other materials of the component.

Compared with optoelectronic components comprising these conventional silicones, the component according to the invention exhibits surprising property improvements in terms of moisture and temperature resistance as well as composite stability.

The resistance of silicones to moisture and temperature can be determined e.g. experimentally via an increase in weight after exposure to moisture or a decrease in weight after thermal loading of the silicone. A suitable measurable variable for characterising composite stability is shear strength, for example. Corresponding evidence of the improved properties of the polyorganosiloxanes according to the invention compared with conventional silicone can be found in the exemplary embodiments.

The first organosiloxane preferably comprises one or more monomer units of general formula (I)

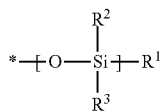

wherein $R^1$ is a $C_2$-$C_{10}$ alkenyl and $R^2$ and $R^3$ are, independently of one another, a $C_1$-$C_{10}$ alkyl or aryl, $C_2$-$C_{10}$ alkenyl or *—O.

$R^1$ is preferably vinyl. $R^2$ and $R^3$ are, each independently of one another, preferably methyl, ethyl, propyl or phenyl. In a further preferred monomer unit, at least one of $R^2$ and $R^3$ is a further $C_2$-$C_{10}$ alkenyl or *—O. For example, $R^2$ can be methyl, ethyl, propyl or phenyl and $R^3$ is $C_2$-$C_{10}$ alkenyl or *—O. It is also possible that, in certain monomer units, $R^2$ and $R^3$ are both *—O or are both $C_2$-$C_{10}$ alkenyl. In particular, combinations of the above-mentioned monomer units can be present in the first organosiloxane.

The term alkyl within the meaning of the present invention has the meaning commonly used in the prior art and comprises saturated aliphatic groups including unbranched and branched as well as cyclic carbon chains. Alkyl therefore likewise comprises a cycloalkyl, i.e. a ring-shaped saturated hydrocarbon residue, which can comprise one or more rings. A cycloalkyl within the meaning of the present invention is preferably a $C_3$-$C_{10}$ cycloalkyl.

The term alkenyl likewise comprises a cycloalkenyl and therefore designates an alkyl or cycloalkyl having one or more double bonds.

The term aryl here denotes a monocyclic or bicyclic ring system, wherein at least one of the rings of the system is aromatic.

An alkoxy group is based on an alkyl group bonded to an oxygen atom.

An epoxy group refers to a cyclic ether having three ring atoms.

As used here, *—O designates an oxygen atom that links the monomer unit to an adjacent silicon atom in the organosiloxane.

The first organosiloxane preferably comprises at least two monomer units of general formula (I). Furthermore, the first organosiloxane can comprise an average of 2 to 2000, preferably 20 to 1000, monomer units of general formula (I).

The second organosiloxane preferably comprises one or more monomer units of general formula (II)

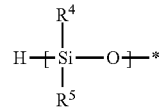

wherein $R^4$ and $R^5$ are, independently of one another, a $C_1$-$C_{10}$ alkyl or aryl, a hydrogen or *—O.

Preferably, $R^4$ and $R^5$ are, each independently of one another, methyl, ethyl, propyl or phenyl. In a further preferred monomer unit, at least one of $R^4$ and $R^5$ is hydrogen or *—O. For example, $R^4$ can be methyl, ethyl, propyl or phenyl and $R^5$ can be hydrogen or *—O. In certain monomer units, $R^4$ and $R^5$ can also both be hydrogen or *—O. In particular, combinations of the above monomer units can also be present in the second organosiloxane.

The second organosiloxane preferably has at least two monomer units of formula (II). The second organosiloxane can also comprise an average of 2 to 3000, preferably 20 to 1000, monomer units of general formula (II).

The total number of silicon atoms in the first and second organosiloxane is preferably 2 to 3000, preferably 20 to 1000.

The alkoxysilane preferably has a general formula (III)

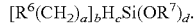

$R^6$ here is a $C_2$-$C_{10}$ epoxyalkyl or epoxyalkoxy and $R^7$ is a $C_1$-$C_{18}$ alkyl or aryl, a=0 to 10, b=1, 2 or 3, c=0, 1 or 2, d=1, 2 or 3, and a+b+c+d=4 applies.

$R^6$ is preferably glycidoxy or epoxycyclohexyl.

$R^7$ is preferably a $C_1$-$C_4$ alkyl, in particular methyl.

Preferably, a is 1 to 4; b is preferably 1; c is preferably 0; d is preferably 3.

In a preferred variant, the alkoxysilane is an (epoxyalkoxy)alkyltrialkoxysilane. Particularly preferred is gamma-glycidoxypropyltrimethoxysilane.

In a further preferred variant, the alkoxysilane is an (epoxycycloalkyl)alkyltrialkoxysilane. Particularly preferred are beta-(3,4-epoxycyclohexyl)ethyltrimethoxysilane and beta-(3,4-epoxycyclohexyl)ethyltriethoxysilane. Mixtures of the above alkoxysilanes are also possible.

The alkoxysilane is preferably present in a proportion of 0.1 to 20 wt. %, based on the total weight of the composition. Furthermore, 1 to 10 wt. % is preferred and 2 to 5 wt. % is particularly preferred, based on the total weight of the composition.

The inventors of the present invention were able to establish that, within these ranges, particularly advantageous properties of the polyorganosiloxane are achieved after curing, particularly in terms of optical properties, moisture- and temperature-related characteristics and shear strength.

The first organosiloxane is preferably present in a proportion of between 50 and 99 wt. %, based on the total weight of the composition. The proportion of the first organosiloxane is preferably between 70 and 95 wt. %. A proportion of the first organosiloxane of between 80 and 90 wt. % is particularly preferred.

The second organosiloxane is preferably present in a proportion of between 0.5 and 30 wt. %, based on the total weight of the composition. The proportion of the second organosiloxane is preferably between 2 and 20 wt. %. A proportion of the second organosiloxane of between 5 and 10 wt. % is particularly preferred.

Surprisingly, the inventors have found particularly advantageous mechanical and thermomechanical properties of the polyorganosiloxane within the above ranges. At the same time, the composition can be readily processed, exhibits low blistering during curing and leads to low surface tack of the polyorganosiloxane.

At the same time, the inventors were able to achieve improved hardness of the polyorganosiloxane compared with conventional silicones. In particular, the polyorganosiloxane can have a Shore A hardness of at least 40. The Shore A hardness can also be at least 42, 43, 44 or at least 45. The Shore A hardness here is determined under the standard conditions for measuring physical quantities, in particular a reference temperature of 20° C., by means of the indentation hardness using a hardness testing instrument according to DIN 53505, ASTM D 676.

The semiconductor can comprise a radiation-emitting or radiation-detecting semiconductor. A radiation-emitting or radiation-detecting semiconductor is preferably a light-emitting diode (LED), an organic light-emitting diode (OLED), an optoelectronic sensor or a photoactive element such as e.g. a solar cell.

It is possible in this case that the optoelectronic component additionally comprises a radiation-transmitting element, which is arranged in a ray path or detector window of the rays emitted or detected by the semiconductor and comprises the polyorganosiloxane. The radiation-transmitting element can also consist of the polyorganosiloxane.

For example, the radiation-transmitting element can be an encapsulation. The encapsulation can be in direct contact with the semiconductor, e.g. the semiconductor can be at least partially surrounded by the encapsulation. In the contact region between the encapsulation and the semiconductor, a particularly high thermal load and radiation exposure can occur. The polyorganosiloxane according to the invention is surprisingly stable even in direct contact with the radiation-emitting or radiation-detecting semiconductor and, despite the high stress, ensures high reliability of the component.

The radiation-transmitting element can also comprise a lens. It is advantageous here that the polyorganosiloxane according to the invention has high mechanical strength and weathering resistance together with high transparency.

The radiation-transmitting element can further comprise a light conversion element. The light conversion element generally comprises the polyorganosiloxane and an additive, in particular a wavelength-converting substance, which at least partially converts the radiation emitted by the semiconductor to longer-wavelength, and therefore lower-energy, radiation. The radiation-transmitting element can also consist of the polyorganosiloxane and the additive.

A lens and a light conversion element can also each be arranged at a distance from the semiconductor in the ray path or detector window.

It is also possible that combinations of the above-mentioned radiation-transmitting elements are present in the optoelectronic component.

The radiation-transmitting element having a film thickness of 1 mm preferably has a transmission of at least 70%, preferably at least 80%, particularly preferably at least 85%, in a wavelength range of 360 to 1100 nm.

The optoelectronic component can additionally comprise a radiation-reflecting element, which is arranged at least partially to the side of or opposite a radiation-emitting or radiation-detecting main surface of the semiconductor and comprises the polyorganosiloxane and a radiation-reflecting component. The radiation-reflecting element can also consist of the polyorganosiloxane and the radiation-reflecting component. The radiation-reflecting component can be e.g. radiation-reflecting particles of inorganic oxides, such as e.g. $TiO_2$. In this way, the radiation-reflecting component can be coloured in a highly reflective manner.

The inventors have found that the polyorganosiloxane according to the invention exhibits particularly good adhesion to fillers such as $TiO_2$, $Al_2O_3$ or wollastonite and thus effectively prevents degradation effects at the siloxane-filler interface.

The radiation-reflecting element having a film thickness of 1 mm preferably exhibits a reflection of at least 80%, preferably at least 90%, particularly preferably at least 95%, in a wavelength range of 360 to 1100 nm.

The optoelectronic component preferably comprises a package body. The package body surrounds the semiconductor at least in some areas. The package body comprises the polyorganosiloxane or can also consist thereof.

In a further version, the optoelectronic component comprises a carrier, wherein the semiconductor is arranged on the carrier by means of an adhesion promoter. The adhesion promoter contains the polyorganosiloxane or can also consist thereof. A carrier can also be part of the above-mentioned package. The inventors have found that the polyorganosiloxane ensures reliable adhesion between the semiconductor and the carrier, which manifests itself in a particularly high lifespan and reliability of the component.

The adhesion promoter (or adhesive, conductive adhesive or assembly material) between the semiconductor and the carrier preferably has a film thickness of between 1 and 100 μm, preferably between 5 and 20 μm.

In particular, the optoelectronic component comprises a metallic and/or ceramic material, wherein the polyorganosiloxane is arranged in contact with the metallic and/or ceramic material, at least in a partial area. Typical examples of metallic and/or ceramic materials in optoelectronic components are one or more metallic power leads, a metallic support, reflector, bonding wire or heat sink. An example of a ceramic material, besides the fillers already mentioned above, is a ceramic printed circuit board.

Compared with conventional silicones, the polyorganosiloxane according to the invention exhibits improved adhesion to these materials, particularly after thermal and moisture loading, so that the composite stability within the component is improved.

The metallic material can comprise in particular Ag, Au and/or Cu. The ceramic material can comprise e.g. $Al_2O_3$, $Si_3N_4$ or AlN.

The invention additionally relates to a method of producing an optoelectronic component as described above. The method comprises the steps of:
providing the semiconductor and the composition,
thermally crosslinking the composition to obtain the polyorganosiloxane.

For the method according to the invention, the first organosiloxane preferably has an average dynamic viscosity of no more than 100000 millipascal-seconds (mPa·s) at 20° C. An average dynamic viscosity of no more than 50000 mPa·s is preferred, particularly preferably no more than 20000 mPa·s.

The second organosiloxane preferably has an average dynamic viscosity of no more than 100000 mPa·s, preferably no more than 35000 mPa·s and particularly preferably no more than 15000 mPa·s at 20° C.

The composition preferably has an average dynamic viscosity of no more than 100000 mPa·s, preferably no more than 50000 and particularly preferably no more than 20000 mPa·s at 20° C.

These properties lead to improved processability of the composition. Casting, injection moulding, flat film or blown film extrusion are just a few examples of possible processing techniques.

In a preferred embodiment, the composition is thermally crosslinked at a temperature of 60° C. to 180° C. for a period of 5 minutes to 240 minutes and preferably 80° C. to 150° C. for a period of 5 minutes to 120 minutes. An optional additional post-curing process of 60 min to 120 min at 120° C. to 150° C. can also be used. Various organometallic catalysts based on Pt and/or RH, which can be used for silicone crosslinking, are known to the person skilled in the art.

It is possible that the composition has already been crosslinked before being brought together with the semiconductor. For example, a package and/or a carrier or a reflector can first be formed with the composition and then crosslinked to obtain the polyorganosiloxane. The semiconductor is then arranged in the package or on the carrier or reflector.

Alternatively or in addition, the composition and the semiconductor can also be brought together prior to the crosslinking. For example, the semiconductor, optionally after being arranged in a package or on a carrier or reflector, may optionally be potted with the composition. The composition can also be arranged between the semiconductor and, where present, the package or carrier as an adhesion promoter. Furthermore, the composition can be formed in the ray path or detector window of the radiation emitted or detected by the semiconductor as a lens and/or light conversion element. Only after this is the composition crosslinked to obtain the polyorganosiloxane.

The person skilled in the art can easily see that two or more of the above-mentioned steps can also be combined.

In this way, it is possible to manufacture the optoelectronic component according to the invention with little effort and at low cost. The method is time-saving and is suitable for an industrial scale.

Further details, features and advantages of the present invention can be found in the following description of the figures and exemplary embodiments.

These Show the Following:

Figure 1:
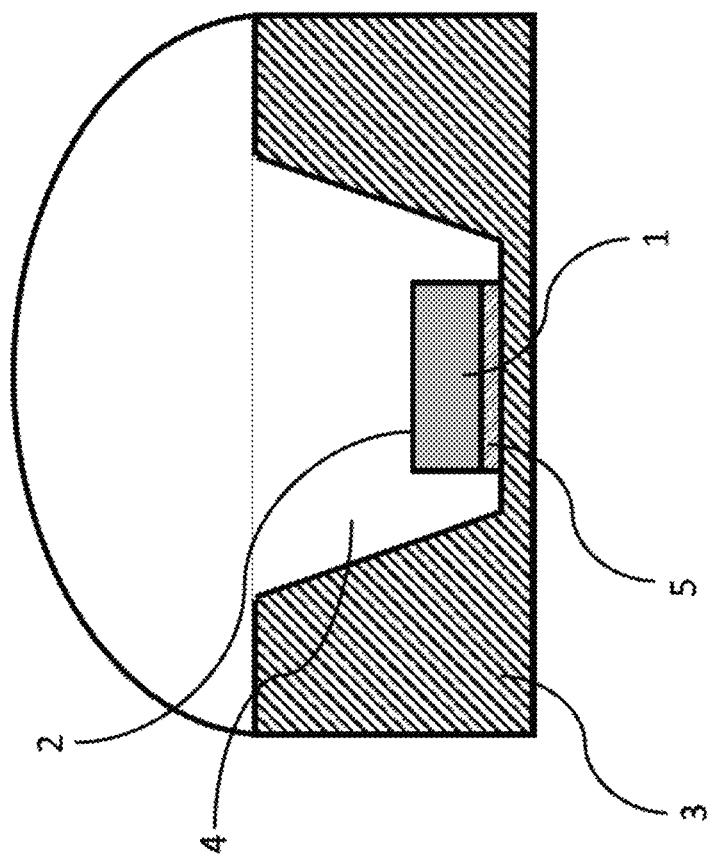
FIG. 1 shows a cross-sectional diagram of an example of an optoelectronic component according to the present invention, wherein the polyorganosiloxane can be contained in one or more of the illustrated components or [one or more of the illustrated components] consists thereof.

An example of an optoelectronic component according to the present invention is illustrated in simplified form in FIG. 1 as a cross-sectional diagram. The component can comprise a package body (3), which partially surrounds an optoelectronic radiation-emitting or radiation-detecting semiconductor (1) having a radiation-emitting or radiation-detecting main surface (2). The semiconductor (1) is connected to the package body (1) e.g. by means of an adhesion promoter (5). In the ray path or detector window of the rays emitted or detected by the semiconductor, an encapsulation (4) can be arranged. The encapsulation can also be formed in a dome or lens shape towards the radiation-emitting or radiation-detecting exterior surface of the component. In the encapsulation, an additive can also be contained, e.g. a dye or phosphor, for example a wavelength-converting substance.

Figure 2:
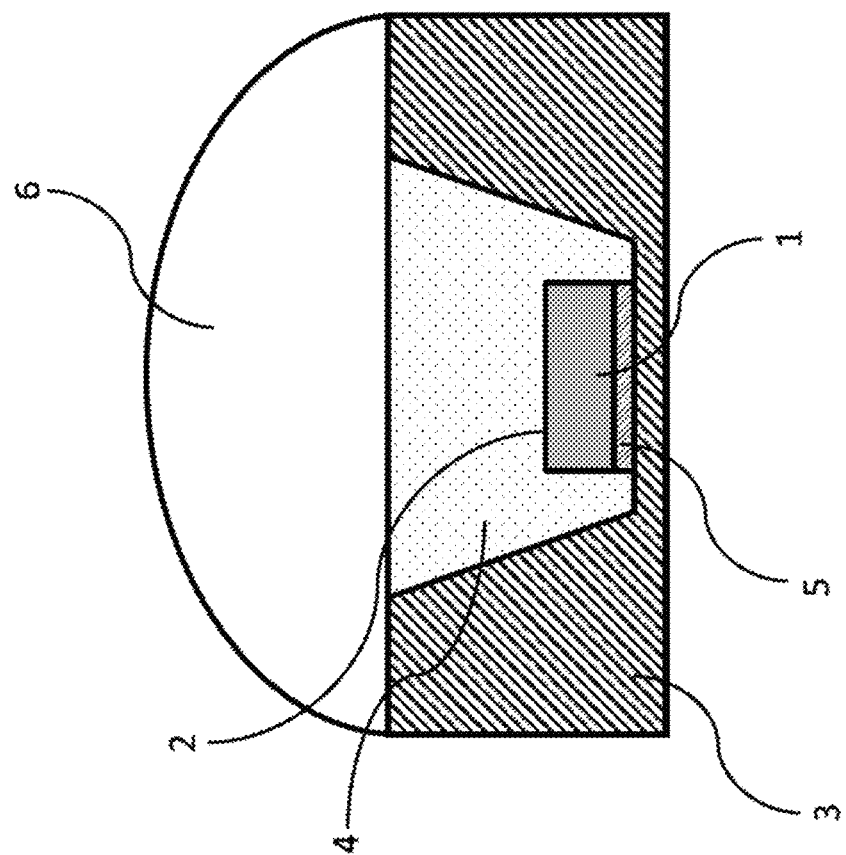
FIG. 2 shows a cross-sectional diagram through a further example of an optoelectronic component according to the present invention, wherein the polyorganosiloxane can be contained in one or more of the illustrated components or [one or more of the illustrated components] consists thereof.

FIG. 2 shows a further version of the optoelectronic component. The same elements are contained as in FIG. 1, with a lens (6) additionally being formed separately from the encapsulation (4). Like the encapsulation, the lens can also contain additives.

Figure 3:
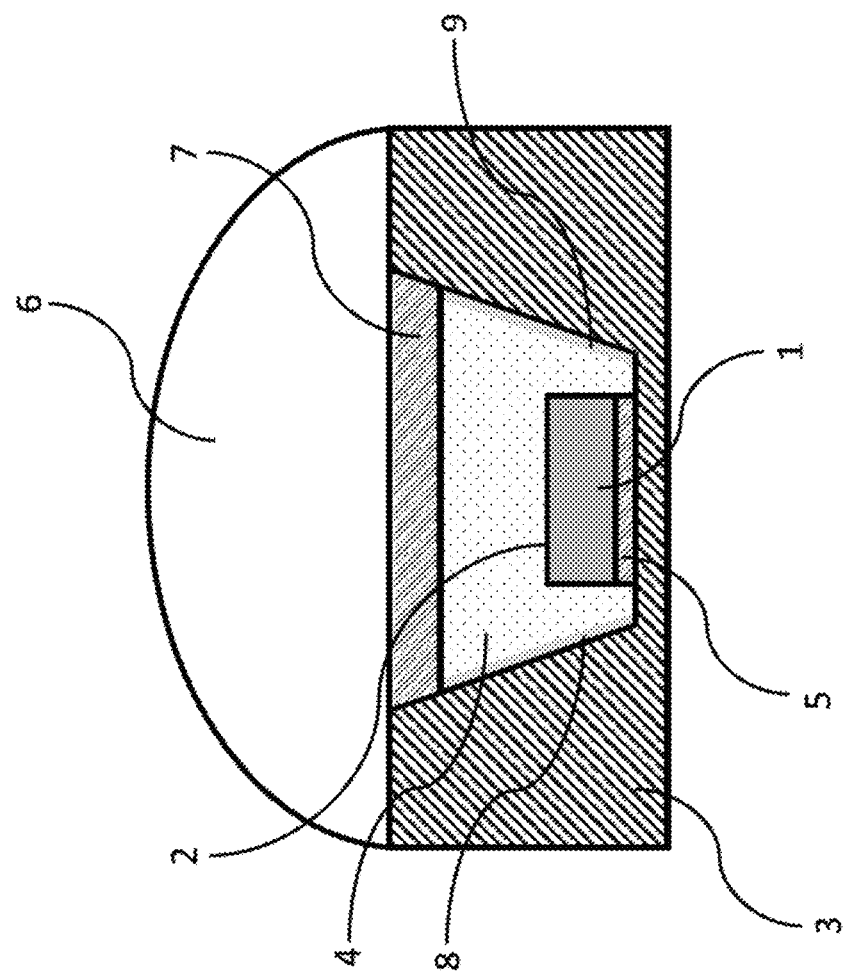
FIG. 3 shows a cross-sectional diagram through a further example of an optoelectronic component according to the present invention, wherein the polyorganosiloxane can be contained in one or more of the illustrated components or [one or more of the illustrated components] consists thereof.

Further elements can also be present, as shown in FIG. 3. For example, a light conversion element (7) can be arranged in the ray path or detector window of the rays emitted or detected by the semiconductor. Furthermore, radiation-reflecting elements (8) and (9) can be arranged partially to the side of and opposite the radiation-emitting or radiation-detecting main surface (2) of the semiconductor (1).

One or more of the illustrated components (3) to (9) can each contain or consist of polyorganosiloxane according to the invention. Moreover, the person skilled in the art can easily see that not all of the illustrated components have to be present but that various combinations and sub-combinations of the illustrated components can also be present.

Various compositions of the polyorganosiloxane according to the invention were compared with a conventional composition (Table 1). The organosiloxanes were thermally curable, addition-crosslinking two-component silicones, such as e.g. 2K silicone from Shin-Etsu. Gamma-glycidoxypropyltrimethoxysilane (CAS 2530-83-8) was used as an example of an alkoxysilane, also referred to below as epoxysilane.

TABLE 1

Tested compositions of epoxysilane-modified polyorganosiloxane. The composition with 0 wt. % epoxysilane was used as a reference.

| Component | Proportion in the composition | | | | |
|---|---|---|---|---|---|
| First organosiloxane | 10.0 | 9.8 | 9.5 | 9.0 | 8.0 |
| Second organosiloxane | 1.0 | 1.0 | 1.0 | 1.0 | 1.0 |
| Epoxysilane | — | 0.2 | 0.5 | 1.0 | 2.0 |
| Epoxysilane in wt. % (based in each case on sum of first organosiloxane and epoxysilane) | 0 | 2 | 5 | 10 | 20 |

The compositions were each cured for one hour at 150° C. Next, the properties of the polyorganosiloxanes obtained were determined (Table 2).

TABLE 2

Properties of the polyorganosiloxanes after curing. The reduction in transmission was measured at room temperature at between 800 and 300 nm using a UV-VIS spectrometer from Perkin Elmer. The moulded materials were approx. 1 mm thick and were produced in a Teflon mould. The Shore A hardness was determined at room temperature using a hardness testing instrument according to DIN 53505, ASTM D676.

| | Epoxysilane in wt. % | | | | |
|---|---|---|---|---|---|
| | 0 | 2 | 5 | 10 | 20 |
| Visual assessment | Transparent | Transparent | Slightly hazy | Hazy | Hazy |
| Reduction in transmission | 7% | 11% | 21% | 21% | 30% |
| Blistering during curing | Low | Low | Low | Low | Low |
| Tack | Low | Low | Low | Low | Low |
| Shore A hardness | 41 | 42 | 45 | 45 | 46 |

The moisture- and temperature-related characteristics of the polyorganosiloxanes according to the invention are shown by way of example in Table 3 with the aid of the polyorganosiloxane having 2 wt. % epoxysilane. As a reference, the measured values for the unmodified silicone are shown.

TABLE 3

Moisture- and temperature-related characteristics

| | Alkoxysilane in wt. % | |
|---|---|---|
| Weight change in % | 0 | 2 |
| After one week at 85° C. and 85% relative humidity | +0.12 | +0.02 |
| After re-drying | +0.12 | No change |
| After 6 weeks at 150° C. | 1.51 | 1.39 |

It can be seen from the measured values that the polyorganosiloxane according to the invention comprising the epoxysilane has lower moisture absorption and a lower loss of mass under thermal stress compared with the conventional silicone without epoxysilane, and thus ensures improved weathering resistance.

The investigation of the thermal expansion behaviour showed that the polyorganosiloxane according to the invention, e.g. with an epoxysilane content of 2 wt. %, exhibits a thermal expansion of 483 ppm/K at a rate of heating of 3 K/min, whereas without the addition of epoxysilane according to the invention, the thermal expansion is 512 ppm/K. The rate of heating during the measurement was 3 K/min under He; the values relate to the temperature range of −50 to 260° C. The lower thermal expansion of the polyorganosiloxane according to the invention results in advantages for the composite stability of the optoelectronic component.

Finally, the shear strength of the polyorganosiloxane according to the invention with a 2 wt. % epoxysilane addition was investigated. To this end, the composition was arranged as an adhesion promoter in a film thickness of 10 μm between a quartz glass cube (2×2 mm) and a carrier layer and cured for one hour at 150° C. Copper, silver and gold layers, as well as an aluminium oxide ceramic, were used as the carrier layers in each case. The shear strength of the conventional silicone without the addition of epoxysilane was used as a reference.

Figure 4:
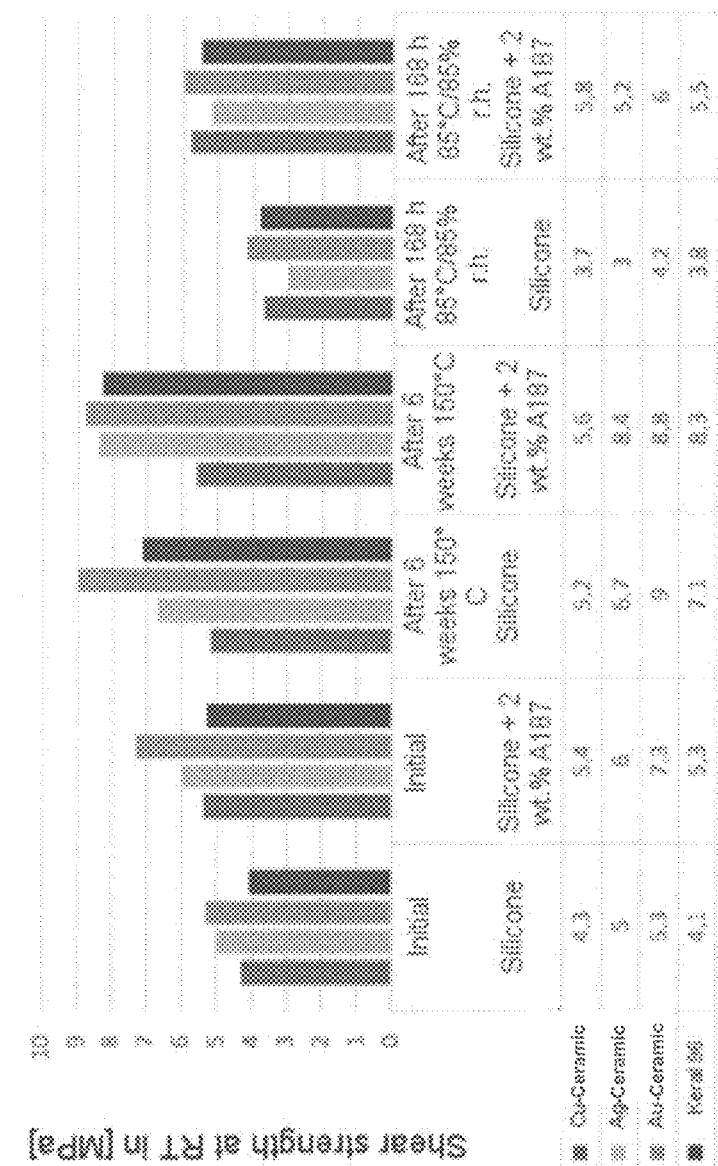
FIG. 4 shows the results of comparative tests on the shear strength of conventional two-component, addition-crosslinking silicone and the polyorganosiloxane of the present invention on metallic and ceramic substrate surfaces.

The results are shown in FIG. 4. The bar graph shows the shear strength in MPa of the conventional silicone and of the polyorganosiloxane according to the invention, each in the initial state as well as after six weeks' weathering at 150° C. and after 168 hours at 85° C. with 85% relative humidity, as a function of the carrier material. The values each represent the averages of ten independent measurements.

It can be seen from the measurements that the polyorganosiloxane according to the invention exhibits improved adhesion to the surfaces tested, both in the initial state and after exposure to heat and humidity. The improved adhesion results in particular advantages for the composite stability and reliability of optoelectronic components produced using the polyorganosiloxane according to the invention.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

This patent application claims the priority of the German patent application 10 2015 101 748.2, the disclosure content of which is hereby incorporated by reference.

The invention claimed is:

1. An optoelectronic component comprising an optoelectronic semiconductor and a polyorganosiloxane obtainable by crosslinking a composition comprising
    a first organosiloxane having at least one terminal vinyl group,
    a second organosiloxane having at least one silicon-hydrogen bond, and
    an epoxysilane having at least one epoxy group,
    wherein the epoxysilane is present in a proportion of 0.1 to 20 wt. %, based on the total weight of the composition,
    wherein the polyorganosiloxane has a Shore A hardness of at least 40, and
    wherein the component additionally comprising a carrier, wherein the semiconductor is arranged on the carrier by means of an adhesion promoter and the adhesion promoter contains or consists of the polyorganosiloxane.
2. The optoelectronic component according to claim 1, wherein the first organosiloxane comprises one or more monomer units of general formula (I)

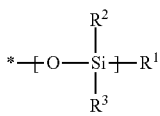

wherein
R¹ is a $C_2$-$C_{18}$ alkenyl, preferably vinyl, and
R² and R³ are, independently of one another, a $C_1$-$C_{18}$ alkyl or aryl, a $C_2$-$C_{18}$ alkenyl or *—O.

3. The optoelectronic component according to claim 1, wherein the second organosiloxane comprises one or more monomer units of general formula (II)

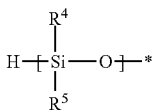

wherein
R⁴ and R⁵ are, independently of one another, a $C_1$-$C_{10}$ alkyl or aryl, a hydrogen or *—O.

4. The optoelectronic component according to claim 1, wherein the epoxysilane has a general formula

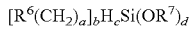

wherein
R⁶ comprises a $C_2$-$C_{10}$ epoxyalkyl or epoxyalkoxy,
R⁷ is a $C_1$-$C_{18}$ alkyl or aryl, and
a=0 to 10, b=1, 2 or 3, c=0, 1 or 2, d=1, 2 or 3 and a+b+c+d=4.

5. The optoelectronic component according to claim 1, wherein the epoxysilane comprises an
(epoxyalkoxy)alkyltrialkoxysilane, in particular gamma-glycidoxypropyltrimethoxysilane, and/or
(epoxycycloalkyl)alkyltrialkoxysilane, in particular beta-(3,4-epoxycyclohexyl)ethyltrimethoxysilane and beta-(3,4-epoxycyclohexyl)ethyltriethoxysilane.

6. The optoelectronic component according to claim 1, wherein the epoxysilane is present in a proportion of 0.1 to 20 wt. %, preferably 1 to 10 wt. %, particularly preferably 1 to 5 wt. %, based on the total weight of the composition.

7. The optoelectronic component according to claim 1, wherein the semiconductor comprises a radiation-emitting or radiation-detecting semiconductor selected from a group consisting of light-emitting diode, organic light-emitting diode, optoelectronic sensor and photoactive element.

8. The optoelectronic component according to claim 7, additionally comprising a radiation-transmitting element, which is arranged in a ray path or detector window of the rays emitted or detected by the semiconductor and comprises or consists of the polyorganosiloxane.

9. The optoelectronic component according to claim 8, wherein the radiation-transmitting element is selected from the group consisting of an encapsulation, a lens and a light conversion element.

10. The optoelectronic component according to claim 7, additionally comprising a radiation-reflecting element, which is arranged at least partially to the side of or opposite a radiation-emitting or radiation-detecting main surface of the semiconductor and comprises or consists of the polyorganosiloxane and a radiation-reflecting component.

11. The optoelectronic component according to claim 1, additionally comprising a package body, wherein the package body surrounds the semiconductor at least in some areas and comprises or consists of the polyorganosiloxane.

12. The optoelectronic component according to claim 1, wherein the component comprises a metallic and/or ceramic material, in particular Ag, Au, Cu and/or $Al_2O_3$, AlN, $Si_3N_4$, SiC or GaN, and the polyorganosiloxane is arranged in contact with the metallic and/or ceramic material at least in a partial area.

13. The optoelectronic component according to claim 1, wherein the component further comprises a heat-dissipating element having a thermal conductivity of 0.5 to 15 W/mK which is applied as a layer on a metallic or ceramic carrier and/or additionally comprises or consists of a package body and the polyorganosiloxane and contains a heat-conductive component, preferably $Al_2O_3$ or wherein the optoelectronic component is used for outdoor applications.

14. A method of producing an optoelectronic component according to claim 1, comprising the steps of
providing the semiconductor and the composition,
thermally crosslinking the composition to obtain the polyorganosiloxane.

15. The method according to claim 14, wherein the first organosiloxane has an average dynamic viscosity at 20° C. of no more than 100000 millipascal-seconds (mPa·s), preferably no more than 50000 mPa·s, particularly preferably no more than 20000 mPa·s and/or
the second organosiloxane has an average dynamic viscosity at 20° C. of no more than 100000 mPa·s, preferably no more than 35000 mPa·s, particularly preferably no more than 15000 mPa·s.

16. The method according to claim 14, wherein the composition has an average dynamic viscosity at 20° C. of no more than 100000 mPa·s, preferably no more than 50000, particularly preferably no more than 20000 mPa·s.

17. An optoelectronic component comprising an optoelectronic semiconductor and a polyorganosiloxane obtainable by crosslinking a composition comprising
a first organosiloxane having at least one terminal vinyl group,
a second organosiloxane having at least one silicon-hydrogen bond and
an epoxysilane having at least one epoxy group,
wherein the epoxysilane is present in a proportion of 0.1 to 20 wt. %, based on the total weight of the composition, and
wherein the polyorganosiloxane has a Shore A hardness of at least 40.

18. The optoelectronic component according to claim 17, additionally comprising a carrier, wherein the semiconductor is arranged on the carrier by means of an adhesion promoter and the adhesion promoter contains or consists of the polyorganosiloxane.

* * * * *